United States Patent
Jones et al.

(10) Patent No.: US 9,888,601 B2
(45) Date of Patent: Feb. 6, 2018

(54) SEMICONDUCTOR MODULE ARRANGEMENT AND METHOD FOR PRODUCING A SEMICONDUCTOR MODULE ARRANGEMENT

(71) Applicant: Infineon Technologies AG, Neubiberg (DE)

(72) Inventors: Patrick Jones, Soest (DE); Christoph Koch, Salzkotten (DE); Michael Sielaff, Erwitte (DE)

(73) Assignee: Infineon Technologies AG, Neubiberg (DE)

( * ) Notice: Subject to any disclaimer, the term of this patent is extended or adjusted under 35 U.S.C. 154(b) by 429 days.

(21) Appl. No.: 14/161,246

(22) Filed: Jan. 22, 2014

(65) Prior Publication Data
US 2014/0204536 A1 Jul. 24, 2014

(30) Foreign Application Priority Data
Jan. 24, 2013 (DE) .................... 10 2013 100 701

(51) Int. Cl.
| | |
|---|---|
| G06F 1/16 | (2006.01) |
| H05K 5/00 | (2006.01) |
| H05K 7/00 | (2006.01) |
| H05K 7/02 | (2006.01) |
| H05K 7/20 | (2006.01) |
| H05K 7/14 | (2006.01) |

(52) U.S. Cl.
CPC ............. *H05K 7/02* (2013.01); *H05K 7/1432* (2013.01); *H05K 7/209* (2013.01); *H05K 7/20409* (2013.01); *H01L 2924/0002* (2013.01); *Y10T 29/41* (2015.01)

(58) Field of Classification Search
CPC ........... H05K 7/02; H05K 7/14; H05K 7/1432
USPC ....... 361/709, 704, 801, 732, 735, 756, 758, 361/802, 804
See application file for complete search history.

(56) References Cited

U.S. PATENT DOCUMENTS

| | | | |
|---|---|---|---|
| 5,956,835 A | 9/1999 | Aksu | |
| 6,008,990 A * | 12/1999 | Liu | ..................... H01L 23/4093 165/80.3 |
| 6,208,527 B1 * | 3/2001 | McMahon | .............. G06F 1/184 361/740 |

(Continued)

FOREIGN PATENT DOCUMENTS

| | | |
|---|---|---|
| CN | 102005447 A | 4/2011 |
| DE | 10348979 A1 | 2/2005 |

(Continued)

*Primary Examiner* — Anthony Haughton
(74) *Attorney, Agent, or Firm* — Murphy, Bilak & Homiller, PLLC

(57) ABSTRACT

A semiconductor module arrangement is provided having a first subassembly, a second subassembly and a third subassembly. The third subassembly has a quantity of adjustment pins which are fixedly connected to one another. The first subassembly has a number N1 of first adjustment openings, and the second subassembly has a number N2 of second adjustment openings. Each of the adjustment pins engages into a different one of the first adjustment openings and/or into one of the second adjustment openings. A corresponding method of producing the semiconductor module arrangement is also provided.

13 Claims, 5 Drawing Sheets

(56) References Cited

U.S. PATENT DOCUMENTS

| | | | | |
|---|---|---|---|---|
| 6,646,881 B1* | 11/2003 | Lai | ................ | H01L 23/4006 |
| | | | | 165/80.3 |
| 6,654,254 B2* | 11/2003 | Szu | ................ | H01L 23/4093 |
| | | | | 24/458 |
| 6,731,505 B1* | 5/2004 | Goodwin | ........... | H01L 23/4093 |
| | | | | 24/458 |
| 6,741,470 B2* | 5/2004 | Isenburg | ............ | H01L 23/4093 |
| | | | | 165/80.3 |
| 6,801,431 B2* | 10/2004 | Hartke | ................ | G06F 1/18 |
| | | | | 165/185 |
| 7,300,298 B2* | 11/2007 | Kameda | ............... | H01R 12/83 |
| | | | | 439/326 |
| 7,583,504 B2* | 9/2009 | Aberg | ............... | H01L 23/4006 |
| | | | | 165/80.3 |
| 8,044,673 B1 | 10/2011 | Burgyan | | |
| 8,558,554 B2 | 10/2013 | Erdman et al. | | |
| 8,587,331 B2 | 11/2013 | Berry et al. | | |
| 8,657,619 B2* | 2/2014 | Lin | ............... | G06F 1/185 |
| | | | | 439/326 |
| 8,723,538 B2 | 5/2014 | Hung et al. | | |
| 8,760,182 B2 | 6/2014 | Wood et al. | | |
| 2009/0241538 A1 | 10/2009 | Yanagisawa et al. | | |
| 2011/0228497 A1* | 9/2011 | Yamamoto | ............ | H05K 1/144 |
| | | | | 361/752 |
| 2013/0017718 A1* | 1/2013 | Lin | ............... | G06F 1/185 |
| | | | | 439/534 |
| 2014/0062516 A1 | 3/2014 | Rashidzadeh et al. | | |

FOREIGN PATENT DOCUMENTS

| | | |
|---|---|---|
| DE | 102009015312 A1 | 10/2009 |
| DE | 102010063387 A1 | 6/2012 |

\* cited by examiner

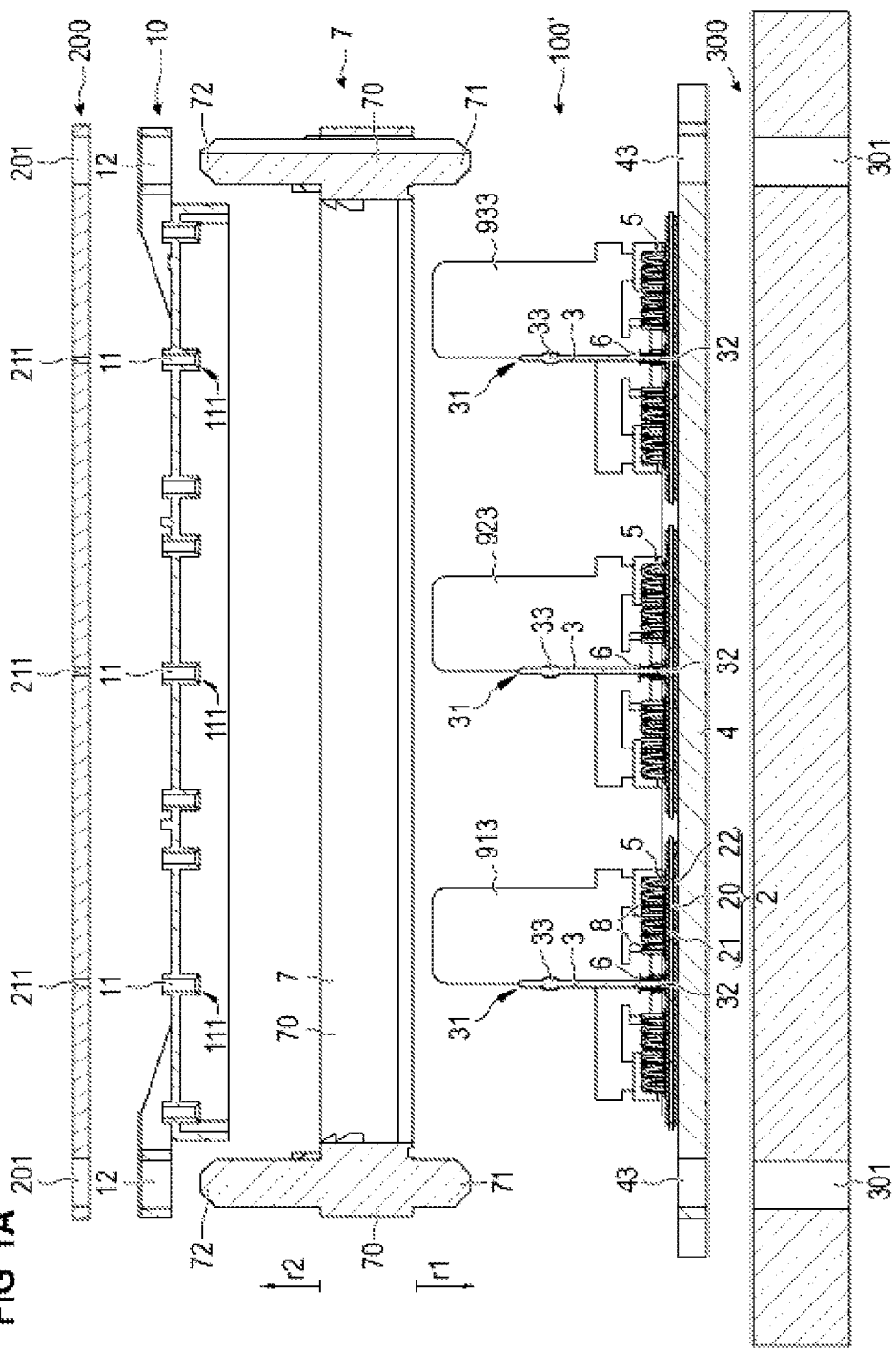

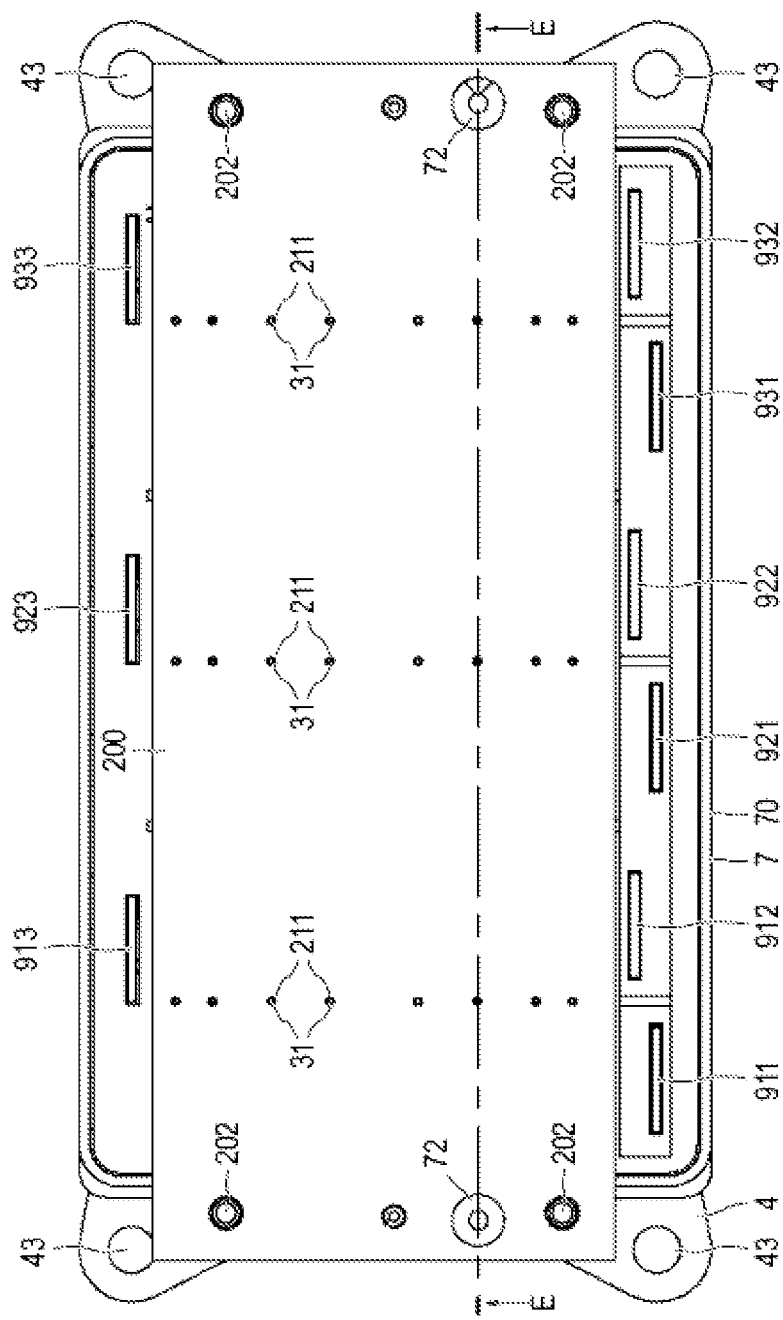

US 9,888,601 B2

SEMICONDUCTOR MODULE ARRANGEMENT AND METHOD FOR PRODUCING A SEMICONDUCTOR MODULE ARRANGEMENT

PRIORITY CLAIM

This application claims priority to German Patent Application No. 10 2013 100 701.5, filed on 24 Jan. 2013, the content of said German application incorporated herein by reference in its entirety.

TECHNICAL FIELD

The invention relates to a semiconductor module arrangement and to a method for producing a semiconductor module arrangement.

BACKGROUND

When fitting semiconductor modules, it is usually necessary to fit several subassemblies to one another. In the process, a very wide variety of tolerances can occur, for example when fitting holes are larger than fastening screws. If three or more subassemblies of a semiconductor module arrangement are fitted to one another, the individual assembly tolerances can add up. This can lead to fitting of further subassemblies being more difficult.

SUMMARY

According to embodiments described herein, a semiconductor module arrangement and a method for producing a semiconductor module arrangement are provided, in which three or more subassemblies of the semiconductor module arrangement are or can be fitted with a high level of accuracy in respect to positioning in relation to one another.

The semiconductor module arrangement which is to be produced has a first subassembly, a second subassembly and a third subassembly. The third subassembly comprises a quantity of adjustment pins which are fixedly connected to one another, the first subassembly comprises a number N1 of first adjustment openings, and the second subassembly comprises a number N2 of second adjustment openings. Each of the adjustment pins engages into one of the first adjustment openings and/or into one of the second adjustment openings.

Since the adjustment pins, as a constituent part of the third subassembly, are fixedly connected to one another and serve to adjust both the first subassembly and the second subassembly relative to the third subassembly, they ensure a high degree of accuracy in respect of fitting for the first subassembly in relation to the second subassembly.

In this case, one, several or all of the adjustment pins can engage in each case only into one adjustment opening in the first subassembly or in the second subassembly, or else both into an adjustment opening in the first subassembly and also into an adjustment opening in the second subassembly.

In the first-mentioned case, the third subassembly can optionally have a number N1≥1 of first adjustment pins and a number N2≥1 of second adjustment pins, the first subassembly can comprise a number N1 of first adjustment openings into which in each case a different one of the first adjustment pins engages, and the second subassembly can have a number N2 of second adjustment openings into which in each case a different one of the second adjustment pins engages. In this case, the totality of the N1 first adjustment pins and the N2 second adjustment pins can form the quantity of adjustment pins which are fixedly connected to one another.

When producing semiconductor module arrangements of this kind, the first subassembly, the second subassembly and the third subassembly are initially provided as assemblies which are independent of one another and are not connected to one another. In this case, all of the adjustment pins from amongst the quantity of adjustment pins which are fixedly connected to one another constitute an integral constituent part of the third subassembly and as a result are fixedly connected to one another. As a result, the first subassembly, the second subassembly and the third subassembly are arranged relative to one another in such a way that each of the adjustment pins engages into one of the first adjustment openings and/or into one of the second adjustment openings.

Those skilled in the art will recognize additional features and advantages upon reading the following detailed description, and upon viewing the accompanying drawings.

BRIEF DESCRIPTION OF THE DRAWINGS

The invention is described below using exemplary embodiments with reference to the appended figures. In the figures, identical reference symbols indicate identical elements with the same function. Unless stated otherwise, the elements, features, methods and method steps shown in the various figures can be combined with one another in any desired manner provided that they are not mutually exclusive.

FIG. 1A shows a cross section through a plurality of subassemblies of a semiconductor module arrangement, which subassemblies are to be fitted to one another.

FIG. 3 shows a plan view of the semiconductor module arrangement according to FIG. 1C.

DETAILED DESCRIPTION

Figure 1B:
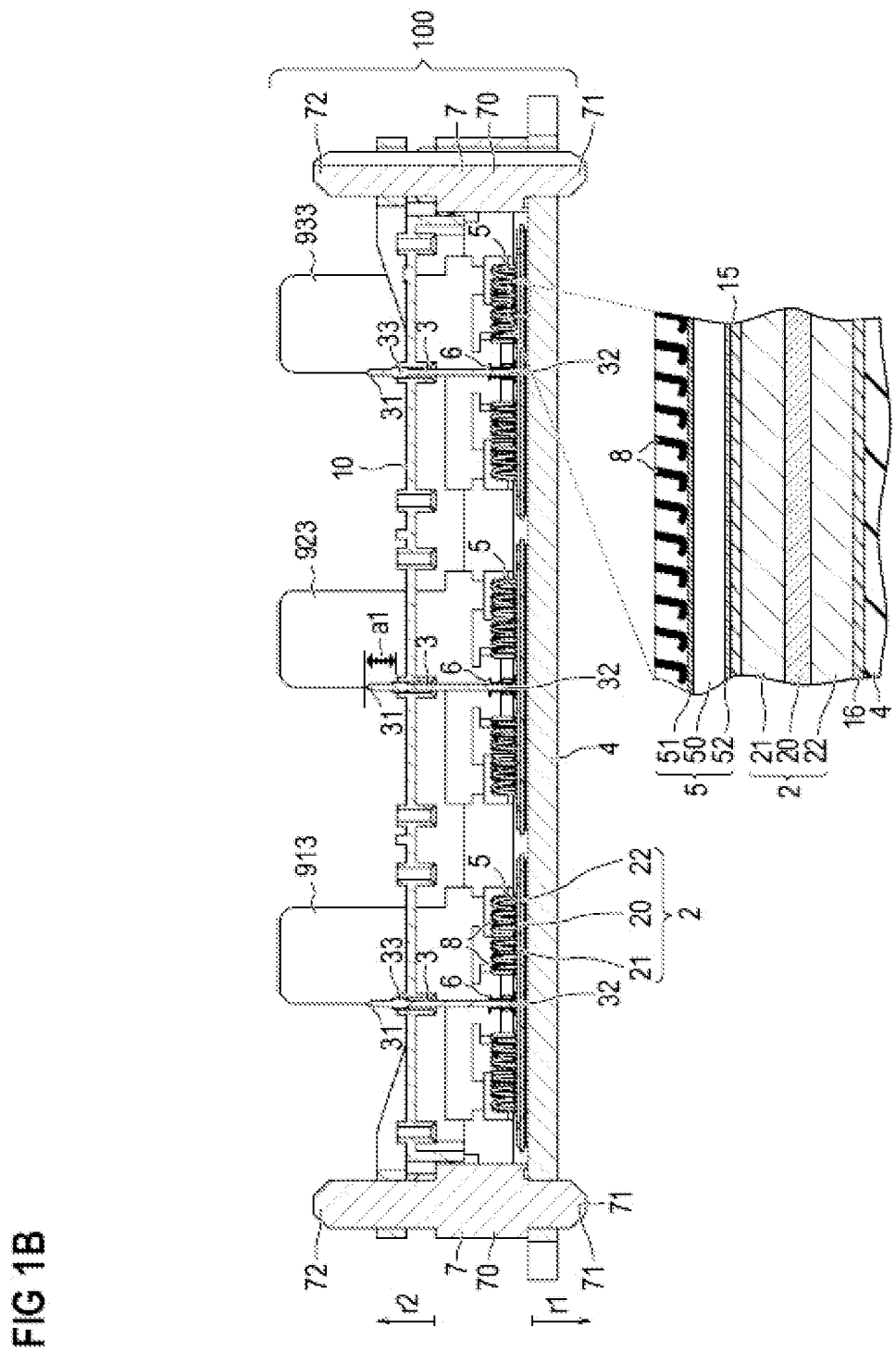
FIG. 1B shows a cross section through a semiconductor module of the arrangement according to FIG. 1A, and also an enlarged section of this semiconductor module.

FIG. 1A shows several subassemblies 4, 7, 10, 200 and 300, at least three of the subassemblies being connected to one another in order to produce a semiconductor module arrangement.

Subassembly 4 is a solid, for example metal, base plate. The base plate 4 can have, for example, a thickness of at least 2 mm. The base plate 4 can be composed, for example, of metal or of a metal matrix composite material (MMC). The base plate 4 can optionally be provided with a thin coating on its top face. A coating of this kind can serve, for example, to improve the ability to solder the base plate 4, it being possible for this to be achieved with a nickel coating for example. A thin coating can, however, also serve to make it easier to establish a sintered connection. In this case, the coating can be composed, for example, of a noble metal such as silver or gold.

The base plate 4 can optionally be populated with one or more circuit mounts 2, it being possible for each of the circuit mounts 2, for its part, to be populated with one or more semiconductor chips 5 on its face which is averted from the base plate 4. It is also possible for only precisely one, precisely two or else more than three circuit mounts 2 to be provided instead of the shown three circuit mounts 2. The assemblage comprising the base plate 4 and the at least one populated circuit mount 2 constitutes a main semiconductor module 100'.

In each case, a construction of this kind serves to dissipate the lost heat which is produced during operation of the finished semiconductor module arrangement, in particular in the semiconductor chips 5, to a heat sink 300 via the respective circuit mount 2, which is situated beneath the semiconductor chip 5, and the base plate 4. To this end, the heat sink 300 is placed in thermal contact with that face of the base plate 4 which is averted from the semiconductor chips 5. In order to improve the thermal coupling between the base plate 4 and the heat sink 300 in this case, a thermally conductive paste can be introduced between the base plate 4 and heat sink 300. The heat sink 300 constitutes a separate subassembly. A housing 7, a housing cover 10 and a printed circuit board 200 can be present as further subassemblies.

FIG. 1B shows a main semiconductor module 100 which is formed by fitting the housing 7 and the cover 10 to the main module 100'. The cover 10 is, however, optional, that is to say it can also be omitted. Similarly, the cover 10 can also be in the form of a fixed constituent part of the housing 7.

A section of the semiconductor module 100 or of the main module 100' from the region of one of the circuit mounts 2 is illustrated on an enlarged scale in FIG. 1B. However, the construction in the region of the other circuit mounts 2 is identical in principle. At least one semiconductor chip 5 is arranged on each of the circuit mounts 2.

The semiconductor chips 5 each have a semiconductor body 50 which is provided with an upper contact metallization 51 and a lower contact metallization 52. A semiconductor chip 5 of this kind can be, for example, a controllable semiconductor switch, for example a MOSFET, an IGBT, a JFET, a thyristor or any desired other controllable semiconductor switch, or a non-controllable semiconductor switch, such as a diode for example. The upper and lower contact metallizations 51, 52, respectively, can form, for example, source and drain, drain and source, emitter and collector, collector and emitter, anode and cathode or cathode and anode. If a semiconductor chip 5 is a controllable semiconductor switch, it has a control connection, that is to say a gate connection or a base connection, which is formed by a further metallization (not illustrated) which can be located on the top face of the semiconductor body 50 next to the upper contact metallization 51 and electrically insulated from the upper contact metallization 51, or can be located on the bottom face of the semiconductor body 50 next to the lower contact metallization 52 and electrically insulated from the lower contact metallization 52.

The base semiconductor module 100' can have, for example, precisely one or else several individual semiconductor switches. It is likewise possible, for example, for two individual switches to be connected in series so as to form a half-bridge. In this case, one semiconductor module 100 can contain, for example, precisely one, precisely two, precisely three or else more than three half-bridges of this kind. In principle however, a circuit mount 2 can be populated in any desired manner.

Each of the circuit mounts 2 has a dielectric insulation carrier 20 which is provided with an upper metallization layer 21 on its top face. The upper metallization layer 21 can be patterned or unpatterned. The insulation carrier 20 can optionally be provided with a lower metallization layer 22 on its bottom face which is averted from the upper metallization layer 21. In this case, the upper metallization layer 21 and the lower metallization layer 22 can be electrically insulated from one another.

The upper metallization layer 21 and/or—if provided— the lower metallization layer 22 can be composed, for example, of copper, a copper alloy, aluminum, an aluminum alloy, but also any other metal. The insulation carrier 20 can be in the form of, for example, ceramic and be composed of, for example, aluminum oxide, aluminum nitride or silicon nitride. The circuit mount 2 may be, for example, a DCB (direct copper bonding) substrate, a DAB (direct aluminum bonding) substrate or an AMB (active metal brazing) substrate. However, it is likewise possible to use a conventional printed circuit board (PCB) as the circuit mount 2.

As can be seen from the section which is illustrated on an enlarged scale, the semiconductor chips 5 are connected to the circuit mount 2, on which they are respectively arranged, with the aid of a connecting layer 15. In this case, the connecting layer 15 makes direct contact both with the lower contact metallization 52 of the semiconductor chip 5 and also with the upper metallization layer 21 of the corresponding circuit mount 2.

If a base plate 4 is provided, each of the circuit mounts 2 is cohesively connected to the base plate 4 with the aid of a connecting layer 16. In this case, the connecting layer 16 makes direct contact both with the lower metallization layer 22 of the corresponding circuit mount 2 and also with the base plate 4.

The connecting layers 15, 16 can be in the form of solder layers or in the form of sintered connecting layers, independently of one another and in any desired combinations with one another. In the case of a sintered connecting layer, the sintered connecting layer can contain, for example, a sintered silver powder.

The housing 7 can provide electrical insulation. The housing 7 can be composed, for example, of thermosetting or thermoplastic material. A housing 7 of this kind can be produced, for example, by means of an injection-molding technique. The housing 7 has a side wall 70 which can optionally also be of annular form and which surrounds, in particular, the circuit mount or mounts 2 and also the semiconductor chip or chips 5 which is/are arranged on the circuit mount or mounts 2.

Electrical connection contacts 3, 913, 923, 933 are provided in order to electrically connect the finished semiconductor module to external components. A load current flows through each of the semiconductor chips 5 during operation of the finished semiconductor module. For this purpose, a "load current" is understood to be a current through a semiconductor chip 5 which current flows through the semiconductor body 50 between source and drain, between emitter and collector or between anode and cathode, that is to say between the upper contact metallization 51 and the lower contact metallization 52. Since load currents of this kind can assume very high values in semiconductor modules, it is necessary for the associated electrical connection contacts to have a high current-carrying capacity. This is achieved by a large conductor cross section of the connection contacts. In the exemplary embodiment shown, the connection contacts 913, 923, 933, which are in the form of stamped and bent metal sheets, constitute some of the load connection contacts. The connection contacts 913, 923, 933 are electrically conductively connected, for example by means of a soldered connecting layer or a sintered connecting layer as explained above, to an upper metallization layer 21 of a circuit mount 2 or to the upper contact metallization 51 of a semiconductor chip 5.

In addition to connection contacts 913, 923, 933 through which a load current flows through one or more semiconductor chips 5, one or more additional connection contacts 3 are also present, the additional connection contacts 3 serving to transmit small signals, as are required, for example, to actuate control connections of a semiconductor chip 5 or to transmit further signals which transmit information about the state of the semiconductor module, such as the temperature of a semiconductor chip 5 for example.

These additional connection contacts 3 are in the form of substantially straight pins which have a free first end 31 and also a second end 32 which is opposite the first end 31. The second ends 32 are each inserted into an electrically conductive, for example metal, sleeve 6 and in this way electrically conductively connected to the corresponding sleeve 6. The sleeves 6, for their part, are electrically conductively connected, for example by soldering, to the upper metallization layer 21 of one of the circuit mounts 2. An electrically conductive connection between a connection pin 3 and a conductor track which is formed in the upper metallization layer 21 can be realized in this way. Over its further course, a conductor track of this kind can be connected to any desired electrical potentials of the circuit which is realized on the circuit mount 2. Bonding wires 8 can likewise optionally be used for this purpose, as for producing any other desired electrical connections.

As explained, the additional connection contacts 3 are suitable primarily for transmitting small electrical signals. However, it is likewise possible to connect two or more connection contacts 3 of this kind electrically in parallel and as a result to increase the current-carrying capacity, so that the parallel circuit comprising the two or more connection contacts 3 can also be used as a load connection for transmitting a load current which flows through one or more semiconductor chips 5.

The additional connection contacts 3 can optionally each have a press-in region 33 which is pressed into a contact hole 211 (see FIG. 1A) in the printed circuit board 200 and in the process is plastically deformed, so that an electrical press-in connection is established between the connection contact 3 and the printed circuit board 200. A press-in connection of this kind can be formed or established, in particular, in accordance with DIN EN 60352-5, as at April 2004.

If a housing cover 10 is provided at all, the additional connection contacts 3 can be routed through corresponding passage openings 11 (see FIG. 1A) in the housing cover 10, so that the free ends 31 and the press-in regions 33 project out of the passage openings 11 in the housing cover 10 on that face of said housing cover which is averted from the semiconductor chip or chips 5.

The housing cover 10 can optionally have a respective insertion funnel 111 on that face of the passage openings 11 which faces the base plate 4. The input opening (that is to say the width of the opening of the insertion funnel 111 at that end from which the connection contacts 3 are pushed into the insertion funnel 111, that is to say on the bottom face in this case) of the insertion funnel 111 is larger than an input opening of the passage openings 11 (that is to say the width of the opening of the passage opening 11 at that end from which the connection contacts 3 are pushed into the passage opening 11, that is to say on the bottom face in this case). Insertion funnels 111 of this kind ensure that the free first ends 31 are received and inserted into the passage openings 11 when the housing cover 10 is mounted.

As explained, the printed circuit board 200 is provided with electrical contact openings 211. The contact openings 211 can, for example, be in the form of metallized passage openings, the metallization of the passage openings 211 being electrically connected to conductor tracks (not illustrated here) of the printed circuit board 200. Conductor tracks of this kind can be located, for example, on the upper face and/or on the lower face, but in addition or as an alternative also in the interior, of the printed circuit board 200. Since the contact openings 211 are smaller than the press-in regions 33 before the connection contacts 3 are pressed in, the press-in regions 33 are plastically deformed by the pressing-in process.

In order to allow accurate relative positioning of at least three of the subassemblies, base plate 4 (not populated, or else as a constituent part of an above-described main semiconductor module 100'), housing 7 (with or without housing cover 10), housing cover 10, printed circuit board 200 and heat sink 300, a third of the at least three subassemblies, in this case the housing 7, has a quantity of adjustment pins 71, 72 which are fixedly connected to one another. Each of the adjustment pins 71, 72 engages into a different one of one or more first adjustment openings 43 in a first subassembly (4) of the at least three subassemblies, in this case the base plate 4, and/or into a different one of one or more second adjustment openings 201 of a second subassembly (200) of the at least three subassemblies, the result of this being illustrated in FIG. 1C.

Figure 1C:
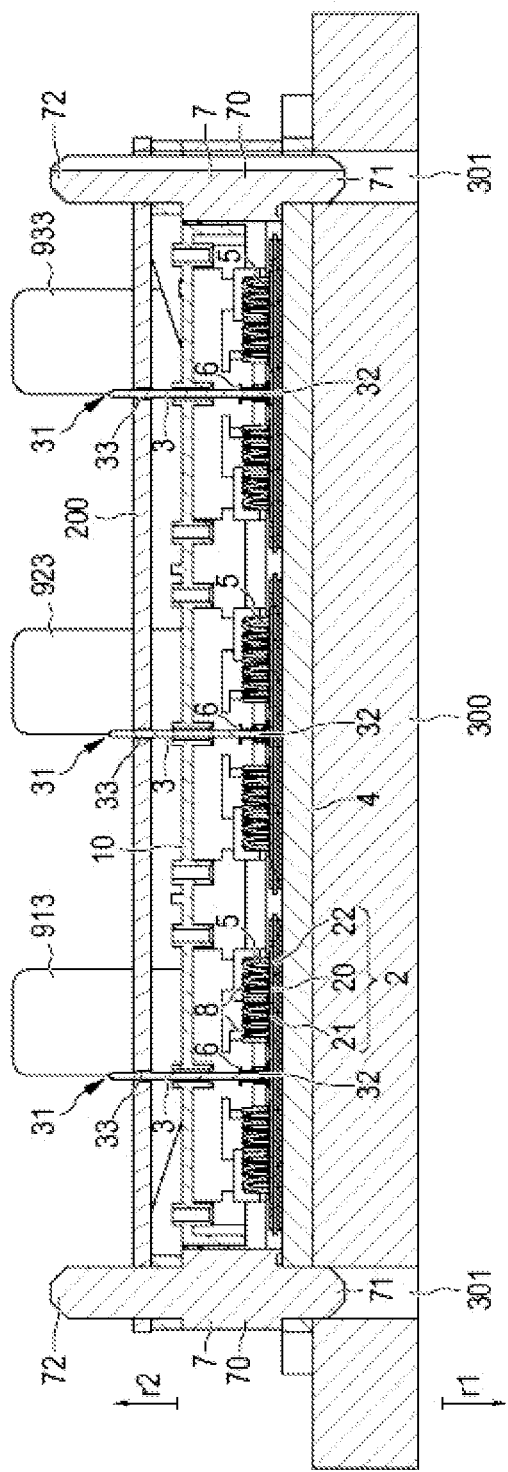
FIG. 1C shows a cross section through the subassemblies which are fitted to one another with the aid of adjustment pins.

This includes a first alternative which is shown in FIG. 1C, according to which the quantity of adjustment pins 71, 72 which are fixedly connected to one another can be divided into two pin groups: into a first pin group with one or more first adjustment pins 71 and into a second pin group with one or more second adjustment pins 72, wherein the first adjustment pins 71 each engage into first adjustment openings 43 in the first subassembly 4, and the second adjustment pins 72 each engage into second adjustment openings 201 in the second subassembly 200. The adjustment pins 71 of the first pin group therefore engage into adjustment openings 43 in a (first) subassembly (4) which is different from the (second) subassembly (200), the adjustment pins 72 of the second pin group engaging into the adjustment openings 201 in the second subassembly 200.

According to a second alternative which is likewise shown in FIG. 10, from amongst the quantity of adjustment pins (in this case: 71) of the third subassembly, in this case the housing 7, it is possible for each of the adjustment pins 71 to also engage both into an adjustment opening 43 (see FIG. 1A) in the first subassembly, in this case the base plate 4, and into an adjustment opening 301 in the second subassembly, in this case the heat sink 300.

Since the housing cover 10 and the side wall 70 are present as separate components in the example shown, the second alternative is optionally realized for a second time in FIG. 1C by, from amongst the quantity of adjustment pins (in this case: 72) of the third subassembly, in this case the housing 7, each of the adjustment pins 72 engaging both into an adjustment opening 12 (see FIG. 1A) in the first subassembly, in this case the housing cover 10, and into an adjustment opening 201 in the second subassembly, in this case the printed circuit board 200.

The totality of the first alternative and the second alternative therefore involves, in principle, that is to say not only in the present example but in all other refinements of the invention, the quantity of adjustment pins which are fixedly connected to one another (in the example: 71 with 72 in the first alternative and 71 or 72 in the two second alternatives)

are a constituent part of a third subassembly and, in their totality, serve to engage both into adjustment openings in a first subassembly and in a second subassembly, so that (at least) the first, the second and the third subassemblies can be positioned relative to one another.

The examples which are explained in the figures are intended merely to illustrate the principle of the invention. In the example in FIGS. 1A to 1C for explaining the first alternative, the third subassembly, that is to say the subassembly which contains the quantity of adjustment pins 71, 72, is provided by the housing 7. However, it is possible for the third subassembly to also be provided by any desired other subassembly of the semiconductor module arrangement in the two alternatives. Similarly, the first subassembly and the second subassembly can be any desired other subassemblies of the semiconductor module arrangement. It is important only that the first, the second and the third of the at least three subassemblies are separate assemblies which are different from one another before they are fitted to one another. Therefore, the first subassembly, the second subassembly and the third subassembly can be chosen as desired, in particular, from the following assemblies: (I) in the form of a base plate (4), populated or unpopulated; (II) in the form of a housing (7) with or without a housing cover (10); (III) in the form of a housing cover (10); (IV) in the form of a heat sink (300); (V) in the form of a printed circuit board (200). Furthermore, it is important for all of the adjustment pins 71, 72 of the third subassembly to also be fixedly connected to one another and therefore form a stable unit when the subassemblies are not yet connected to one another, that is to say in particular when the third subassembly is present as a separate part.

In all of the refinements in which one of the subassemblies is provided by a base plate 4, the base plate 4 can be unpopulated, but also populated. For example, the base plate 4 can be cohesively connected to one or more circuit mounts 2, each of which, for its part, is cohesively connected to a semiconductor chip 5 which is located on that face of the circuit mount 2 which is averted from the base plate 4.

Furthermore, a third subassembly, including the quantity of adjustment pins, can be integrally formed and in this case optionally be composed of a uniform, homogeneous material. In this case, the material can be electrically insulating or electrically conductive. For example, in the arrangement according to FIG. 1C, the adjustment pins 71, 72 and the housing side wall 70 can be produced together in combination by an injection-molding process.

In the first alternative which is explained using FIG. 1C, the first adjustment pins 71 can extend away from a main body (70) of the third subassembly 7 in a first direction r1, and the second adjustment pins 72 can extend away from the main body 70 in a second direction r2 which is opposite to the first direction r1.

As is further shown by way of example in FIG. 1C, one, several or each of the N1 first adjustment pins 71 and/or one, several or each of the N2 second adjustment pins 72 can be in the form of a blade pin. In this case, a 'blade pin' is to be understood to be a pin which has a non-circular outer circumference in a sectional plane transverse to the direction r1 or r2 in which it extends, so that the pin, when it is inserted into a cylindrical opening, has a press fit in a first radial direction which is perpendicular to the insertion direction, and has slight play in a second radial direction which is perpendicular both to the insertion direction and also to the first radial direction. As a result, the blade pin is therefore subject to play only in a radial direction, this leading to a particularly high level of accuracy in respect of adjustment.

Furthermore, all of the adjustment pins 71, 72 which are fixedly connected to one another, can be formed without a thread in all of the refinements of the invention.

It is optionally possible, both in the first alternative and in the second alternative, for there to also be one or more further subassemblies, in addition to the first subassembly, the second subassembly and the third subassembly, each of said further subassemblies having one or more adjustment openings into which in each case one of the quantity of adjustment pins of the third subassembly engages after all of the subassemblies are fitted.

Both in the first alternative and in the second alternative, the first subassembly can have a number N1 of first adjustment openings, wherein N1 can be equal to 1 or greater than 1, and the second subassembly can have a number N2 of second adjustment openings, wherein N2 can also be equal to 1 or greater than 1.

Figure 2:
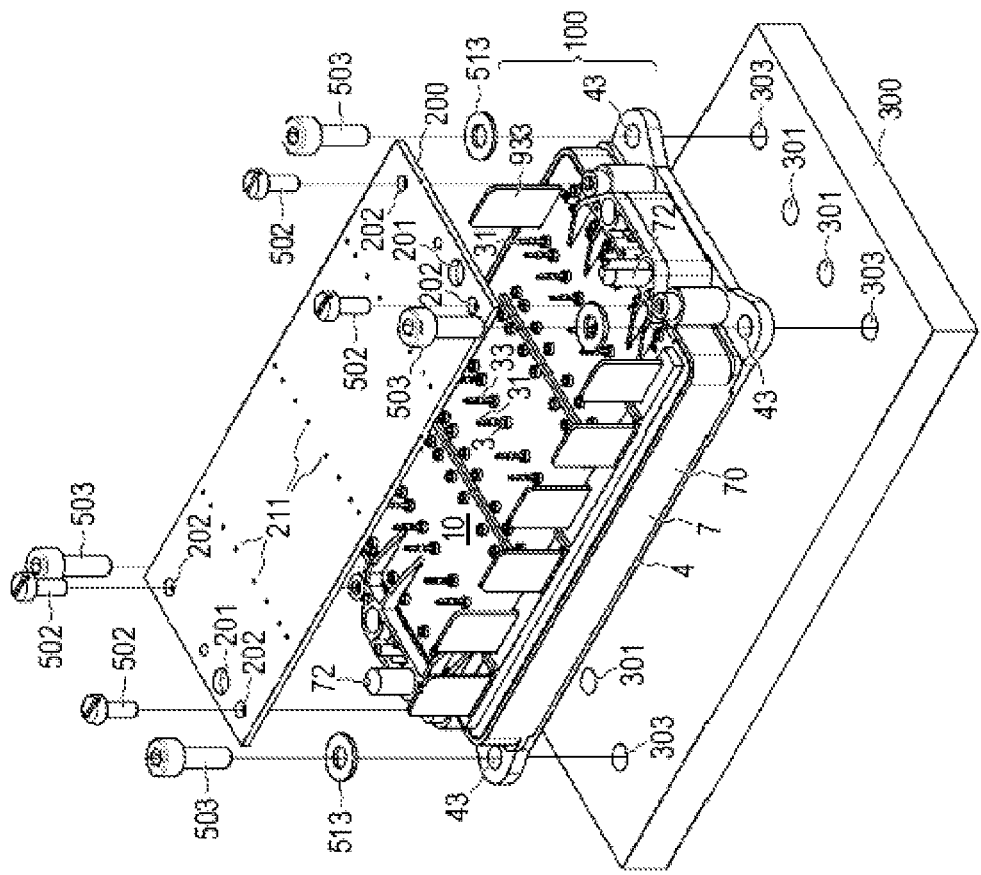
FIG. 2 shows a perspective exploded illustration of the semiconductor module arrangement according to FIG. 1C, with the additional illustration of connecting screws.

FIG. 2 further shows an exploded illustration of the arrangement according to FIG. 1C, wherein different screws for fastening the elements to one another are additionally illustrated. Screws 502 which engage into passage openings 202 in the printed circuit board 200 serve to secure the printed circuit board 200 to the semiconductor module 100. Further screws 503 serve, in connection with optional washers 513, to screw the power semiconductor module 100 to the base plate 4 using threaded holes 303 in a heat sink 300 by the screws 503 being passed through fitting openings 43 in the base plate 4 and being screwed into the threaded holes 303. Corresponding securing screws can also be used in all of the other refinements.

FIG. 3 further shows a plan view of the semiconductor module arrangement which is shown in FIG. 1C, but without the screws 502, 503 which are shown in FIG. 2 and also without the heat sink 300. The sectional plane E-E' which is associated with FIGS. 1A to 1C is likewise illustrated.

As can also be gathered from the view according to FIGS. 2 and 3, the semiconductor module 100 can have further load connection contacts 911, 921, 931, for example for connecting a positive supply voltage, and also further load connection contacts 912, 922, 932, for example for connecting a negative supply voltage. These connection contacts 911, 912, 921, 922, 931, 932, like the connection contacts 913, 923, 933, can be in the form of stamped and bent metal sheets and be connected to one or more of the circuit mounts 2.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module arrangement, comprising:
a first subassembly having a number N1 of first adjustment openings;
a second subassembly having a number N2 of second adjustment openings; and
a third subassembly having a plurality of adjustment pins which are fixedly connected to one another,
wherein a first set of the plurality of adjustment pins extend beyond a top surface of the third assembly,
wherein a second set of the plurality of adjustment pins extend beyond a bottom surface of the third assembly,
wherein each pin of the first set of the plurality of adjustment pins is vertically aligned with a corresponding pin of the second set of the plurality of adjustment pins to form a pair of vertically aligned adjustment pins,
wherein each of the first set of the plurality of adjustment pins engages into one of the first adjustment openings,
wherein each of the second set of the plurality of adjustment pins engages into one of the second adjustment openings,
wherein the plurality of adjustment pins constitutes an integral constituent part of the third subassembly prior to the subassemblies being connected to one another.

2. The semiconductor module arrangement of claim 1, wherein:
the third subassembly has a number N1≥1 of the first set of the plurality of adjustment pins;
the first subassembly has a number N1 of first adjustment openings into which in each case a different one of the first set of the plurality of adjustment pins engages;
the third subassembly has a number N2≥1 of the second set of the plurality of adjustment pins;
the second subassembly has a number N2 of second adjustment openings into which in each case a different one of the second set of the plurality of adjustment pins engages; and
the totality of the N1 first set of the plurality of adjustment pins and the N2 second set of the plurality of adjustment pins forms the quantity of adjustment pins which are fixedly connected to one another.

3. The semiconductor module arrangement of claim 1, wherein the first subassembly, the second subassembly and the third subassembly are in each case a different one of the following subassemblies I to V:
(I) a base plate;
(II) a housing;
(III) a housing cover;
(IV) a heat sink; and
(V) a printed circuit board.

4. The semiconductor module arrangement of claim 3, wherein the base plate is cohesively connected to a circuit mount which is cohesively connected to a semiconductor chip, and wherein the semiconductor chip is arranged on a face of the circuit mount which is averted from the base plate.

5. The semiconductor module arrangement of claim 1, wherein the third subassembly is integrally formed and is composed of a uniform, homogeneous material.

6. The semiconductor module arrangement of claim 5, wherein the uniform, homogeneous material is a metal or a plastic or a molding compound.

7. The semiconductor module arrangement of claim 2, wherein:
the third subassembly has a main body;
the first set of the plurality of adjustment pins extend away from the main body in a first direction; and
the second set of the plurality of adjustment pins extend away from the main body in a second direction opposite to the first direction.

8. The semiconductor module arrangement of claim 7, wherein the main body is an annular plastic frame of a housing in which a semiconductor chip is arranged.

9. The semiconductor module arrangement of claim 1, wherein:
the first subassembly is a base plate cohesively connected to a circuit mount;
the circuit mount is cohesively connected to a semiconductor chip which is arranged on a face of the circuit mount which is averted from the base plate; and
the second subassembly is a printed circuit board.

10. The semiconductor module arrangement of claim 8, further comprising:
a heat sink having a number N1 of further adjustment openings into which in each case a different one of the adjustment pins engages.

11. The semiconductor module arrangement of claim 2, wherein:
one, several or each of the N1 first set of the plurality of adjustment pins is a blade pin; and/or
one, several or each of the N2 second set of the plurality of adjustment pins is a blade pin.

12. The semiconductor module arrangement of claim 1, wherein all of the adjustment pins are devoid of a thread.

13. The semiconductor module arrangement of claim 1, wherein the plurality of adjustment pins is plastic molded to a sidewall of the third subassembly.

* * * * *